United States Patent [19]

McNicol et al.

[11] Patent Number: 5,170,495
[45] Date of Patent: Dec. 8, 1992

[54] CONTROLLING CLIPPING IN A MICROWAVE POWER AMPLIFIER

[75] Inventors: John D. McNicol; Stephen G. Harman, both of Nepean, Canada

[73] Assignee: Northern Telecom Limited, Montreal, Canada

[21] Appl. No.: 607,385

[22] Filed: Oct. 31, 1990

[51] Int. Cl.$^5$ .................. H04B 1/04; H04B 11/12; H03G 3/20

[52] U.S. Cl. .................. 455/116; 455/126; 455/127; 330/123; 330/149

[58] Field of Search .................. 455/73, 72, 13.4, 115, 455/15, 20, 24, 108, 116, 118, 126, 127; 332/103, 123, 125; 330/103, 104, 127, 123, 129, 149

[56] References Cited

U.S. PATENT DOCUMENTS

| | | | |
|---|---|---|---|
| 3,900,823 | 8/1975 | Sokal et al. | 455/126 |
| 4,462,001 | 7/1984 | Girard | 330/149 |
| 4,618,999 | 10/1986 | Watkinson | 455/126 |
| 4,639,938 | 1/1987 | Kennett | 455/126 |
| 4,700,151 | 10/1987 | Nagata | 455/126 |
| 4,742,312 | 5/1988 | Osburn et al. | 330/298 |
| 4,893,347 | 1/1990 | Eastmond et al. | 455/72 |
| 5,021,753 | 6/1991 | Chapman | 455/126 |

*Primary Examiner*—Reinhard J. Eisenzopf
*Assistant Examiner*—Lisa Charouel
*Attorney, Agent, or Firm*—R. John Haley

[57] ABSTRACT

In a QAM microwave radio communications system an IF (intermediate frequency) input signal is amplified and predistorted, and the amplified IF signal is mixed with a local oscillator signal to produce an RF (radio frequency) signal which is amplified in a power amplifier for transmission, the predistortion compensating for non-linear gain of the power amplifier. Clipping in the power amplifier is controlled by down-converting part of the RF signal to produce an IF output signal, monitoring amplitude distortion of the RF signal by comparing the IF output signal with the IF input signal, and controlling the IF amplifier gain in dependence upon the monitored amplitude distortion.

9 Claims, 4 Drawing Sheets

CONTROLLING CLIPPING IN A MICROWAVE POWER AMPLIFIER

This invention relates to a method of controlling clipping in a power amplifier of an RF (radio frequency) communications system, such as is used in a transmitter of a microwave radio communications system, and to a transmitter for such a system.

BACKGROUND OF THE INVENTION

In a microwave radio communications system for example using QAM (quadrature amplitude modulation), it is well known to mix an IF (intermediate frequency) signal with an LO (local oscillator) signal at a microwave carrier frequency to produce an RF signal which is amplified in a power amplifier and transmitted. As is also well known, such a power amplifier generally has a transfer characteristic which is increasingly non-linear at increasing power levels, eventually reaching a clipping level at which the output amplitude no longer increases with increasing input amplitude, i.e. the output is clipped. It is known to predistort the input to the power amplifier to compensate for its non-linearity, and to limit or back off the input signal amplitude to ensure that the clipping level of the power amplifier is not reached.

A problem with the latter technique is that the amount of back-off which is necessary is difficult to determine and is difficult to realize with accuracy. Due to the limited bandwidth of the radio communications channel, there is a signal overshoot, dependent upon the probability distribution function of the signal, which must be accommodated by the power amplifier. In other words, the peak power of the signal must be reduced by a certain amount, referred to as back-off, below the clipping level of the power amplifier. The required back-off is also affected by particular characteristics of the power amplifier, such as its temperature and output transistor characteristics. In addition, monitoring of the actual output power of the amplifier can be inaccurate due to tolerances of the power monitor and its coupling to the amplifier output.

For these reasons, and the fact that clipping due to an insufficient back-off results in transmission errors, known microwave radio communications systems tend to use a back-off which errs on the side of being too large rather than too small. For example, a 64-QAM system, for which clipping by 2 dB produces symbol errors, which has a 10 watt saturated power amplifier may typically be operated with a 10 dB back-off to provide a maximum output power of only 1 watt.

With microwave radio communications systems increasingly using more QAM states and requiring increased dynamic range, there is an increasing need to improve signal-to-noise ratio, and hence the maximum output power of the power amplifier. Accordingly, it is desirable to reduce the back-off to the least possible amount. However, with such systems using more QAM states the production of errors due to any clipping which does occur is exacerbated. For example, with a 512-QAM system using a 36 MHz symbol rate in a 40 MHz channel, clipping of signal overshoots by only 0.5 dB produces symbol errors.

A transmitter in a microwave radio communications system can be operated with either a fixed or a variable output power. With a fixed output power, the transmitter is continuously operated at a full output power with a back-off which is sufficient to ensure a transmit error rate equal to or better than the residual symbol error rate which is desired in unfaded operation of the system. For a variable output power, a reverse signalling control channel is provided from the receiver back to the transmitter to control the transmitter output power. In this case full transmitter output power is only used when necessary due to fading, or transmission path loss, conditions. The transmit error rate at full power is then only required to be better than the faded receive error rate, which is several orders of magnitude greater than the unfaded residual symbol error rate referred to above. Consequently, variable output power operation requires less back-off at full power operation of the transmitter.

However, even with variable output power operation it is still necessary to provide a back-off which is sufficient to minimize errors but is desirably no greater than this.

Accordingly, an object of this invention is to provide a method of controlling clipping in a microwave power amplifier in such a manner that the back-off is just sufficient to provide a desirably low error rate.

SUMMARY OF THE INVENTION

According to this invention there is provided a method of controlling clipping in a power amplifier of an RF (radio frequency) communications system in which an IF (intermediate frequency) input signal is mixed with a local oscillator signal to produce an RF signal for transmission, comprising the steps of: deriving from the local oscillator signal and the RF signal an IF output signal representative of an output signal of the power amplifier; monitoring amplitude distortion of the RF signal by comparing the IF output signal with the IF input signal; and controlling signal gain between an input for the IF input signal and an output for the RF signal in dependence upon the monitored amplitude distortion thereby to control clipping in the power amplifier.

Preferably the IF input signal is mixed with the local oscillator signal in a saturated mixer to produce the RF signal with a level determined by a level of the IF input signal at the mixer, and the step of controlling signal gain between the input for the IF input signal and the output for the RF signal in dependence upon the monitored amplitude distortion comprises controlling the gain of a first IF input signal amplifier between the input for the IF input signal and the mixer.

In order to compensate for non-linear gain characteristics of the power amplifier, the method advantageously also includes the steps of predistorting and amplifying the IF signal following amplification of the IF input signal in the first amplifier.

In a preferred embodiment of the method of the invention, the step of monitoring amplitude distortion comprises the steps of squaring each of the IF output and IF input signals to produce demodulated signals, integrating a difference between each demodulated signal and a respective adaptive level produced in dependence upon the integration, and producing a gain control signal in dependence upon a difference between the integrated signals.

The invention also provides a transmitter for an RF (radio frequency) communications system, comprising: means for amplifying an IF (intermediate frequency) input signal; a mixer for mixing a local oscillator signal with the amplified IF signal to produce an RF signal; a power amplifier for amplifying the RF signal for transmission; means for producing an IF output signal from the amplified RF signal and the local oscillator signal; means responsive to the IF input signal and to the IF output signal for monitoring amplitude distortion of the amplified RF signal; and means for controlling signal gain, between an input for the IF input signal and an output of the power amplifier, in dependence upon the monitored amplitude distortion thereby to control clipping in the power amplifier.

BRIEF DESCRIPTION OF THE DRAWINGS

The invention will be further understood from the following description with reference to the accompanying drawings, in which similar references are used in different figures to denote similar components and in which.

DESCRIPTION OF THE PREFERRED EMBODIMENT

Figure 1:
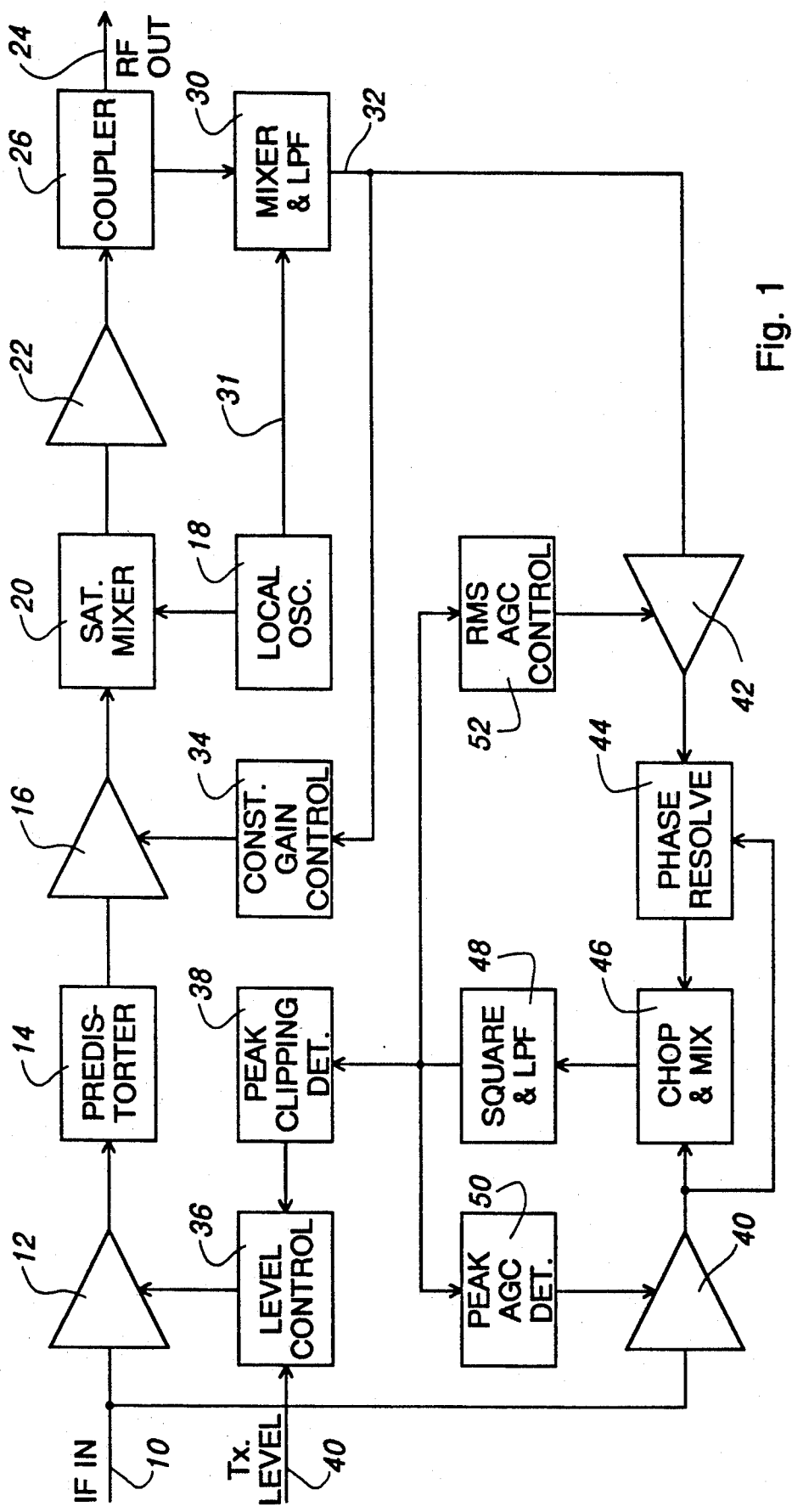
FIG. 1 is a block diagram illustrating parts of a transmitter of a microwave radio communications system in accordance with this invention.

Referring to FIG. 1, parts of a transmitter of a 512-QAM microwave radio communications system are illustrated. An IF (intermediate frequency, e.g. 140 MHz) input signal IF IN including phase quadrature signal components is supplied via a line 10 to a first IF AGC (automatic gain control) amplifier 12, whose output is coupled via a predistorter 14 to a second IF AGC amplifier 16. A local oscillator 18 includes a microwave frequency generator which produces a carrier signal at a microwave frequency of for example 4 GHz, with which the output of the amplifier 16 is mixed in a saturated image reject mixer 20. The mixer 20 can be operated and controlled as described and claimed in S. G. Harman U.S. patent application Ser. No. 7/524,904 filed May 18, 1990 and entitled "Frequency Converter for a Radio Communications System".

The output of the mixer 20 is a single sideband signal which is amplified in a solid state microwave RF (radio frequency) power amplifier 22 and transmitted as an RF output signal RF OUT via a line 24, a small portion of the RF signal being tapped off by a coupler 26. A mixer and LPF (low pass filter) 30 mixes this tapped-off part of the RF signal with a carrier signal component, supplied from the oscillator 18 via a line 31, to produce a coherent IF signal, and low pass filters this to produce an IF signal on a line 32. This IF signal on the line 32 is representative of the RF output signal and accordingly is referred to as an IF output signal. This IF output signal is fed back to a constant gain control circuit 34 which controls the gain of the second IF AGC amplifier 16 to provide a constant signal gain from the output of the predistorter 14 to the RF output line 24, this constant signal gain facilitating the design and implementation of the predistorter 14. In practice, the power amplifier 22 may be switched to provide various levels of gain for different microwave fading conditions, the constant gain control circuit 34 and the predistorter 14 being correspondingly switched. However, such switching is not essential to this invention and accordingly is not described further here.

In the absence of an over-riding control signal from a peak clipping detector 38 as described further below, a level control circuit 36 serves to control the gain of the first IF AGC amplifier 12 in dependence upon a transmit level control signal (Tx.LEVEL) supplied via a line 40. This transmit level control signal is supplied in known manner via a reverse channel from a remote receiver to which the RF output signal on the line 24 is transmitted. In normal operation, when the signal level received by the receiver falls the level control circuit 36 is controlled, via the reverse channel and the transmit level control signal on the line 40, to increase the gain of the first IF AGC amplifier 12, thereby increasing the amplitude of the IF signal supplied to the predistorter 14. In view of the constant gain control provided for the second IF AGC amplifier 16 as described above, and the fact that the mixer 20 is a saturated mixer (i.e. the local oscillator signal supplied to the mixer has a much greater amplitude than the IF signal), the RF output signal level is therefore increased to compensate for the lowered receive signal level.

The IF signals on the lines 10 and 32 are amplified to similar levels by AGC amplifiers 40 and 42 respectively. The output of the amplifier 42, which output is illustrated in FIG. 1 as being phase resolved by a phase resolving circuit 44 which is optionally provided, and the output of the amplifier 40 are supplied to inputs of a chop and mix circuit 46, where they are chopped and alternately supplied to a squaring and LPF (low pass filter) circuit 48. The output of the circuit 48 is supplied to the peak clipping detector 38, whose output constitutes a control signal for the level control circuit 36 as mentioned above. The chopped, alternating output of the circuit 48 is also supplied to a peak AGC detector 50 which controls the gain of the amplifier 40, and to an RMS AGC control circuit 52 which controls the gain of the amplifier 42.

Figure 2:
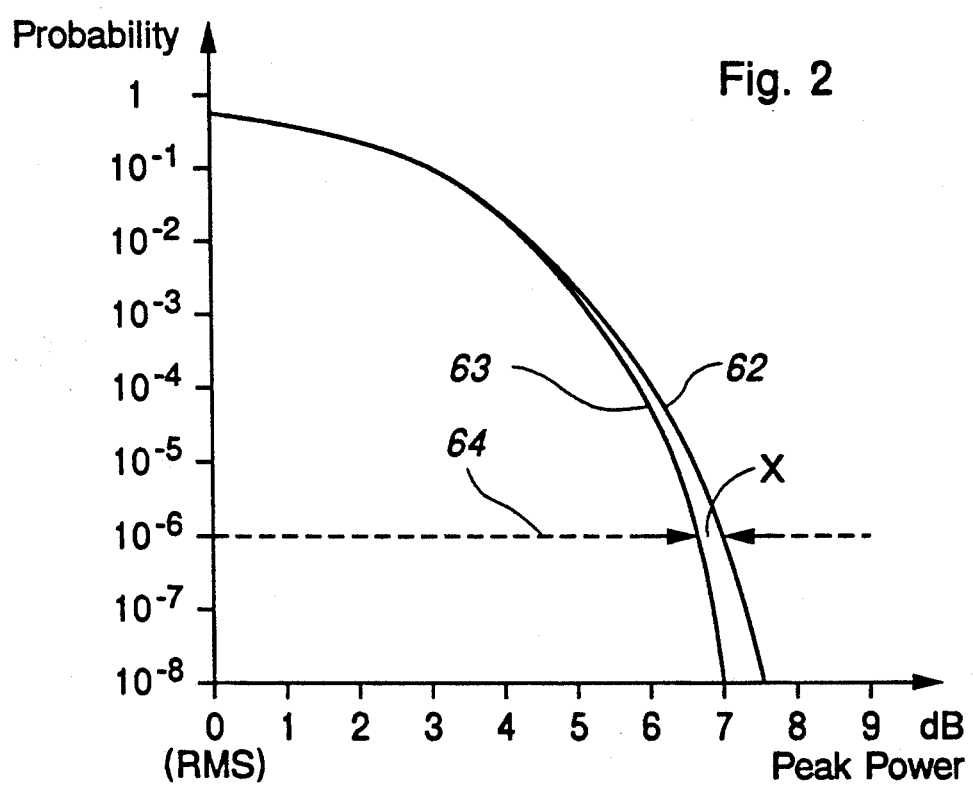
FIG. 2 is a graph illustrating a signal probability distribution function, with reference to which the operation of a peak clipping detector of the transmitter of FIG. 1 is explained.

The operation of the arrangement of FIG. 1 is described below with additional reference to FIG. 2, which is a graph illustrating a signal probability distribution function for the RF envelope of the 512-QAM system. The horizontal axis in FIG. 2 represents peak signal power in decibels (dB), relative to RMS signal power which is represented by the 0 dB power level. The vertical axis in FIG. 2 represents the probability, in accordance with the particular modulation scheme (512-QAM) which is being used, of occurrence of a signal occurring at that or a higher peak power level. A curve 62 represents the probability density function for the undistorted IF input signal on the line 10, and a curve 63 represents the probability density function for the IF output signal on the line 32. The difference between these curves represents the signal compression, or peak clipping amplitude distortion, which remains (after the compensation provided by the predistorter 14) due to the non-linear gain and peak clipping characteristics of the power amplifier 22.

Thus at any signal probability density, for example $10^{-6}$ as shown by a broken line 64 in FIG. 2, the difference X between the curves 63 and 62 represents the amplitude distortion or signal compression which is produced due to peak clipping by the power amplifier 22. The peak clipping detector 38 serves to monitor this difference X at a predetermined signal probability density which is selected to provide an optimum detector response. In the event that this difference X exceeds a threshold level, corresponding to a maximum allowable extent of peak clipping beyond which symbol errors may occur, the level control provided to the circuit 36 via the line 40 is over-ridden and the gain of the first IF AGC amplifier 12, and hence the amplitude of the RF output signal, is limited by the output of the peak clipping detector 38.

Thus in a deep fading situation, the gain of the first IF AGC amplifier 12, and hence the amplitude of the RF output signal, is increased by the reverse channel control via the line 40 until the detector 38 over-rides this to limit peak clipping by the amplifier 22, thereby avoiding symbol errors due to peak clipping in the amplifier 22. As the amplifier 22 is within the control loop, any individual power amplifier 22 is therefore enabled to operate with its individual maximum power output level before excessive peak clipping occurs. Furthermore, the control loop accommodates changing of characteristics of the power amplifier 22 over time. As a result of these factors, the designed level of back-off for the power amplifier 22 can be reduced to a lower level than in the prior art, and any power amplifier 22 is able to operate at its particular maximum power output level.

In order to provide a proper evaluation of the difference X in FIG. 2 by the peak clipping detector 38, equality of the RMS levels of the IF input and output signals on the lines 10 and 32 is established by means of a chopper-stabilized comparison achieved via the components 46, 48, 52, and 42 in FIG. 1. This avoids the more costly task (especially in view of the large peak-to-RMS factor of the IF input signal) of establishing an absolute RMS level for comparison purposes. The peak clipping detector 38 is also chopper-stabilized to compare the IF input and output signal peak values at a common probability density (for example $10^{-6}$ as shown by the broken line 64 in FIG. 2) which, in view of the chopper stabilization, can be set by resistor-capacitor time constants in the peak clipping detector.

Figure 3:
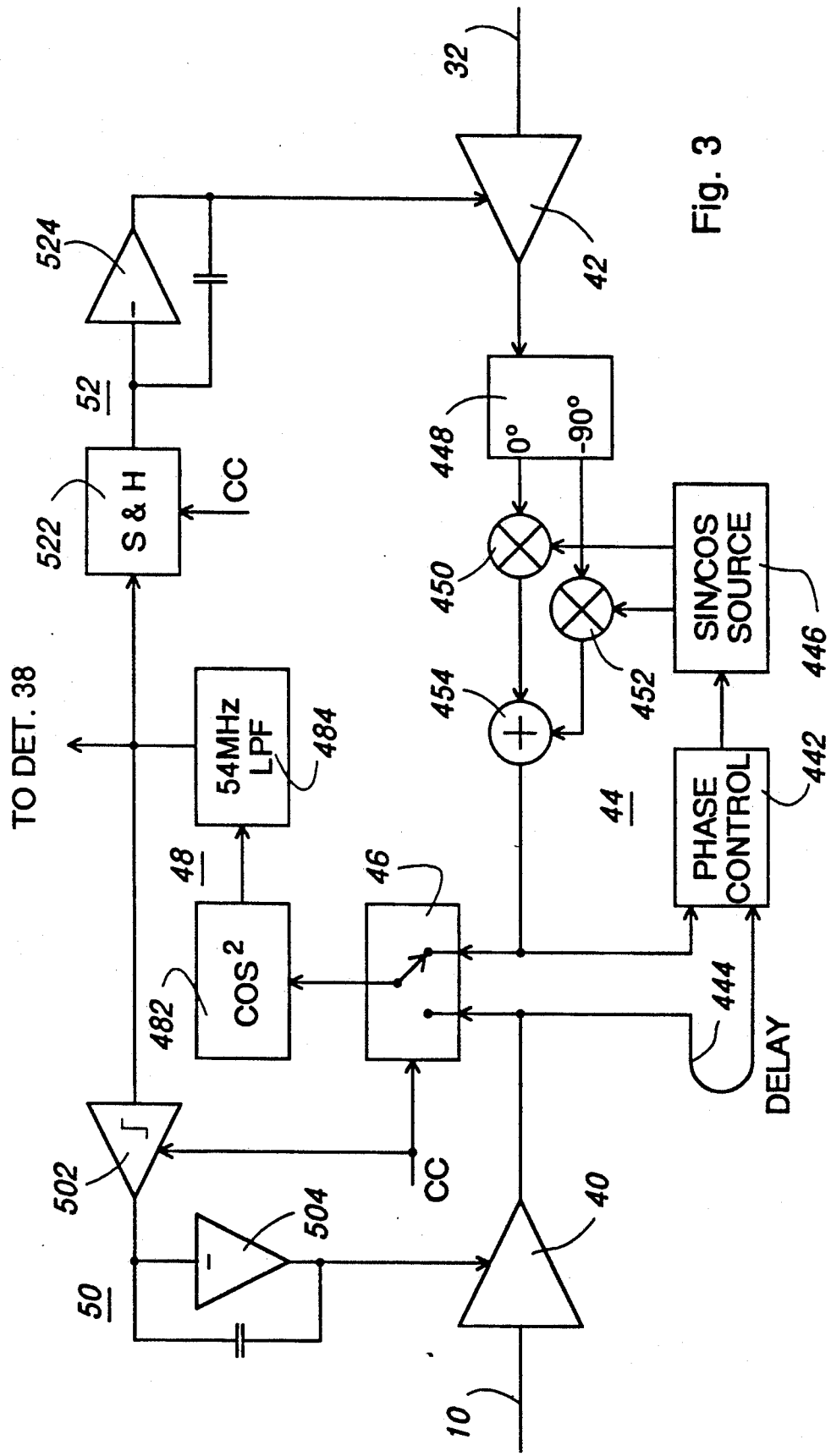
FIG. 3 is a block diagram illustrating in greater detail parts of the transmitter of FIG. 1.

FIG. 3 illustrates the parts 40 to 52 of FIG. 1 in greater detail. As already mentioned above, the phase resolving circuit 44 is optional, but it is illustrated here because it may be provided for other purposes which are not part of this invention. Accordingly the phase resolving circuit 44 can be omitted, the output of the amplifier 42 then being connected directly to the chop and mix circuit 46.

As illustrated in FIG. 3, the phase resolving circuit 44 comprises a phase control circuit 442, a compensating delay line 444, a sin/cos source 446, and a phase rotator comprising a signal coupler 448 having phase quadrature outputs, multipliers 450 and 452, and an adder 454. The phase control circuit 442 comprises a RMS (root mean square) phase detector and a following low pass filter having a cut-off frequency of 54 MHz. The gain-adjusted IF input signal from the amplifier 40 is supplied to one input of the phase control circuit 442 via the delay line 444, and the other input of the phase control circuit 442 is supplied with the gain adjusted and phase resolved IF output signal. The output of the phase control circuit 442 drives the sin/cos source 446, whose outputs are multiplied with phase quadrature components of the IF output signal produced by the coupler 448 from the output of the amplifier 42. The multiplication products are summed by the adder 454 to produce the output of the phase resolving circuit 44. Although not shown in FIG. 3 for simplicity, the phase resolving circuit 44 is chopper stabilized in known manner, for example using a 5 kHz square wave chopper control signal CC which is discussed further below.

The gain-adjusted IF input signal from the amplifier 40, and the gain-adjusted and phase resolved IF output signal from the phase resolving circuit 44, are also supplied to the chop and mix circuit 46, which is represented in FIG. 3 by a selector switch controlled by the chopper control signal CC. Thus at the output of the circuit 46, the two IF signals are produced in a chopped and alternating manner, at the chopper rate of 5 kHz. The chopped, alternating signal is squared in a circuit 482, which has a $\cos^2$ characteristic, to recover base-band magnitude information, and the resulting signal is low pass filtered in a 54 MHz LPF 484, these circuits 482 and 484 together constituting the squaring and LPF circuit 48. The circuit 482 having a $\cos^2$ characteristic provides a simple demodulation of the IF signals, coherent in phase and amplitude with the modulation sidebands of the IF signals. This is much less costly than providing a carrier recovery type of demodulator, and being non-linear expands the signal peaks, making them easier to detect. The output of the LPF 484 is supplied to the peak AGC detector 50 and the RMS AGC control circuit 52 which are shown in FIG. 3, as well as to the peak clipping detector 38.

The peak AGC detector 50 consists of a peak level comparator 502 and an integrator 504. The comparator 502 is controlled by the chopper control signal CC to compare the output of the LPF 484, at chopper times when the circuit 46 is switched to the output of the amplifier 40, with a threshold level to provide an output dependent upon peak levels of the IF input signal, and this output is integrated by the integrator 504 to provide an AGC control signal for the amplifier 40. The RMS AGC control circuit 52 comprises a sample-and-hold circuit 522 and an integrator 524. The sample-and-hold circuit 522 is controlled by the chopper control signal CC to sample the output of the LPF 484 at chopper times when the circuit 46 is switched alternately to its two inputs, and its output, representing any difference between the RMS levels of the IF input and output signals as supplied to the circuit 46, is integrated by the integrator 524 and used to control the gain of the amplifier 42 so that any RMS level difference is eliminated.

Figure 4:
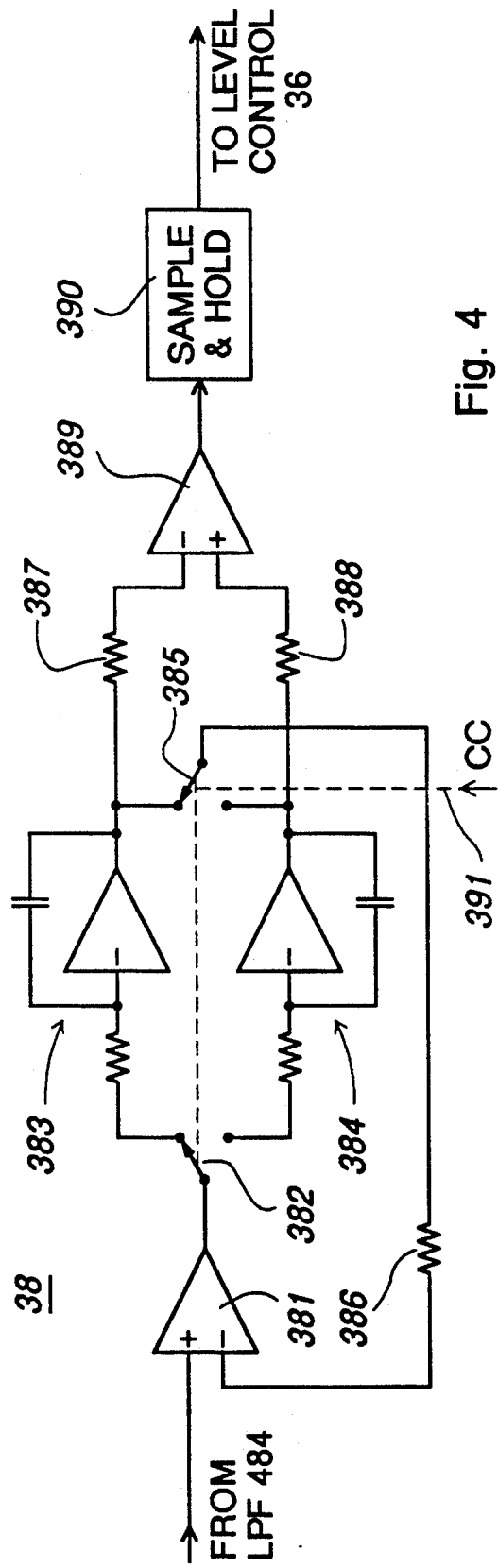
FIG. 4 illustrates the peak clipping detector of the transmitter of FIG. 1 in greater detail.

Referring to FIG. 4, the peak clipping detector 38 comprises a differential amplifier 381 having a non-inverting (+) input to which the output of the LPF 484 is supplied, and having an output which is coupled via a switch 382 alternately to the inputs of two integrating circuits 383 and 384. Outputs of the integrating circuits are coupled alternately via a switch 385 and a feedback resistor 386 to an inverting input (−) of the amplifier 381, and are coupled via resistors 387 and 388 respectively to differential inputs of a differential amplifier 389. A sample and hold circuit 390 samples the output of the amplifier 389 to produce an output signal of the peak clipping detector, which is supplied to the level control circuit 36. As already indicated, when this output signal exceeds a threshold level corresponding to a maximum allowable extent of peak clipping, it overrides the gain control of the first IF AGC amplifier 12 by the reverse channel signal on the line 40 and directly reduces the gain of the amplifier 12 to maintain the peak clipping to a low level at which symbol errors are avoided.

As shown by a broken line 391, the switches 382 and 383 are controlled in synchronism in dependence upon the chopper control signal CC. Thus the integrating circuits 383 and 384 are alternately connected to operate with the amplifier 381 during respective half cycles of the signal CC. As the output of the LPF 484 contains signal components derived alternately at the chopper frequency from the IF output and input signals due to the operation of the chop and mix circuit 46, the integrating circuit 383 operates to integrate a difference formed by the amplifier 381 between its output and a signal component derived from the IF output signal, and the integrating circuit 384 operates to integrate a difference formed by the amplifier 381 between its output and a signal component derived from the IF input signal. As a result, the outputs of the integrating circuits 383 and 384 track the average power of the IF output and IF input signals respectively.

The parameters of the peak clipping detector 38, e.g. the resistor magnitudes and integration time constants, are selected so that the integrating circuits operate at a predetermined signal probability density, for example $10^{-6}$ as shown by the line 64 in FIG. 2, this being determined by adaptive feedback of a level via the resistor 386 to the amplifier 381, which acts to amplify the difference between the input from the LPF 484 and this adaptive level (for each state of the switches 382 and 385). The outputs of the integrating circuits 383 and 384 thus correspond to the intersections of the curves 63 and 62, respectively, with the line 64. As the amplifier 389 forms the difference between the outputs of these integrating circuits and is sampled and held to produce the peak clipping detector output, this output represents the amount of signal compression or amplitude distortion, X as shown in FIG. 2, which occurs between the IF input line 10 and the RF output line 24.

As should be readily appreciated, this signal compression will increase as clipping of the signal by the power amplifier 22 occurs and increases. Thus the detector output provides a clear indication of how close the input signal amplitude to the power amplifier 22 is to clipping levels within this amplifier. If clipping occurs, the compression X and hence the output of the compression detector 50 will be large, whereas if there is no clipping the compression X and hence the output of the compression detector 50 will be small.

As already described, if the output of the peak clipping detector 38 exceeds a threshold level set in the level control circuit 36, it is used to over-ride the gain control via the line 40 and directly to reduce the gain of the first IF AGC amplifier 12, thereby reducing the amplitude of the IF signal at the output of the first IF AGC amplifier 12. As this amplitude also determines the amplitude of the RF signal supplied to the power amplifier 22, because the mixer 20 is a saturated mixer, the power amplifier input signal level is also reduced to reduce the peak clipping or signal compression.

A closed loop is thus formed which maintains the maximum signal compression produced by the amplifier at a desired low level. In this manner, the power amplifier 22 can be operated at the highest signal level, and hence signal to noise ratio, which is possible without excessive signal distortion which causes errors.

Furthermore, this arrangement provides that, if the performance of the power amplifier degrades for example over time or with changing temperature, the signal distortion is not increased but is maintained constant by decreasing the input signal amplitude to the power amplifier. In contrast, in known microwave radio communications systems degradation of the power amplifier results in an increased signal level being supplied to the power amplifier to try to maintain a constant output power level, thereby resulting in increased signal distortion and hence increased error rates.

Although one particular, preferred, form of peak clipping detector has been described above, it should be appreciated that other forms of detector may be provided. For example, the IF input and output signals could instead be phase aligned and normalized, and their difference (representing the compressed or clipped part of the signal) correlated with the occurrence of amplitude peaks in the IF signal to produce a signal indicative of the amount of compression or clipping, which signal can be used in the same manner as described above to control the gain of the first IF AGC amplifier in an adaptive manner.

In addition, although as described above the gate of the first IF AGC amplifier 12 is controlled, a saturated mixer 20 being used so that the IF signal level directly determines the RF signal level supplied to the power amplifier 22, instead the gain of the second IF AGC amplifier, the gain of the power amplifier 22, or the attenuation of a signal attenuator in the signal path (for example at the input to the power amplifier 22) could be controlled to achieve a corresponding result. However, these latter arrangements are not preferred because they would complicate the necessary control of the predistorter 14, and because it is much easier to control the gain of the first IF AGC amplifier than to control the gain of the RF power amplifier 22.

It should also be appreciated that, although in the above described arrangement a synchronous down-conversion is used in the mixer and LPF 32 to produce the IF output signal, this is not essential to the invention because the peak clipping detector 38 is only responsive to the signal magnitudes. Thus in the above arrangement, and particularly in a multi-carrier communications system such as may be used for cellular radio communications, asynchronous down-conversion of the tapped-off part of the RF output signal could instead be used to produce the IF output signal. In this case the phase resolving circuit 44 would be omitted as described above, because its bandwidth would be too narrow for it to operate in this asynchronous arrangement.

Numerous modifications, variations, and adaptations may be made to the described embodiment of the invention without departing from the scope of the invention as defined in the claims.

What is claimed is:

1. A method of controlling clipping in a power amplifier of an RF (radio frequency) communications system in which an IF (intermediate frequency) input signal is mixed with a local oscillator signal to produce an RF signal for transmission, comprising the steps of:
    deriving from the local oscillator signal and the RF signal an IF output signal representative of an output signal of the power amplifier;
    monitoring amplitude distortion of the RF signal by comparing the IF output signal with the IF input signal; and
    controlling signal gain between an input for the IF input signal and an output for the RF signal in dependence upon the monitored amplitude distortion thereby to control clipping in the power amplifier.

2. A method as claimed in claim 1 wherein the step of monitoring amplitude distortion comprises the steps of squaring each of the IF output and IF input signals to produce demodulated signals, integrating a difference between each demodulated signal and a respective adaptive level produced in dependence upon the integration, and producing a gain control signal in dependence upon a difference between the integrated signals.

3. A method as claimed in claim 1 wherein the IF input signal is mixed with the local oscillator signal in a saturated mixer to produce the RF signal with a level determined by a level of the IF input signal at the mixer, and the step of controlling signal gain between the input for the IF input signal and the output for the RF signal in dependence upon the monitored amplitude distortion comprises controlling the gain of a first IF input signal amplifier between the input for the IF input signal and the mixer.

4. A method as claimed in claim 3 and including the steps of predistorting and amplifying the IF signal following amplification of the IF input signal in the first amplifier.

5. A method as claimed in claim 3 wherein the step of monitoring amplitude distortion comprises the steps of squaring each of the IF output and IF input signals to produce demodulated signals, integrating a difference between each demodulated signal and a respective adaptive level produced in dependence upon the integration, and producing a gain control signal in dependence upon a difference between the integrated signals.

6. A transmitter for an RF (radio frequency) communications system, comprising:
   means for amplifying an IF (intermediate frequency) input signal;
   a mixer for mixing a local oscillator signal with the amplified IF signal to produce an RF signal;
   a power amplifier for amplifying the RF signal for transmission;
   means for producing an IF output signal from the amplified RF signal and the local oscillator signal;
   means responsive to the IF input signal and to the IF output signal for monitoring amplitude distortion of the amplified RF signal; and
   means for controlling signal gain, between an input for the IF input signal and an output of the power amplifier, in dependence upon the monitored amplitude distortion thereby to control clipping in the power amplifier.

7. A transmitter as claimed in claim 6 wherein the mixer is a saturated mixer for producing the RF signal with a level determined by the amplitude of the amplified IF input amplitude and the means for controlling signal gain in dependence upon the monitored signal distortion comprises means for controlling the gain of the means for amplifying the IF input signal.

8. A transmitter as claimed in claim 7 wherein the means for amplifying the IF input signal comprises a first IF amplifier to which the IF input signal is supplied, a second IF amplifier, and a predistorter coupling an output of the first IF amplifier to an input of the second IF amplifier and the means for controlling signal gain in dependence upon the monitored amplitude distortion comprises means for controlling the gain of the first IF amplifier.

9. A transmitter as claimed in claim 8 wherein the means for monitoring amplitude distortion comprises means for squaring each of the IF output and IF input signals to produce demodulated signals, means for integrating a difference between each demodulated signal and a respective adaptive level produced in dependence upon the integration, and means for producing a gain control signal in dependence upon a difference between the integrated signals.

* * * * *